(12) United States Patent
Fan

(10) Patent No.: US 12,066,705 B2
(45) Date of Patent: Aug. 20, 2024

(54) DISPLAY UNIT, SPLICING SCREEN, AND DISPLAY DEVICE

(71) Applicants: Huizhou China Star Optoelectronics Display Co., Ltd., Huizhou (CN); TCL China Star Optoelectronics Technology Co., Ltd., Shenzhen (CN)

(72) Inventor: Yongping Fan, Huizhou (CN)

(73) Assignees: Huizhou China Star Optoelectronics Display Co., Ltd., Huizhou (CN); TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/642,710

(22) PCT Filed: Feb. 25, 2022

(86) PCT No.: PCT/CN2022/078034
§ 371 (c)(1),
(2) Date: Mar. 14, 2022

(87) PCT Pub. No.: WO2023/151138
PCT Pub. Date: Aug. 17, 2023

(65) Prior Publication Data
US 2024/0045250 A1    Feb. 8, 2024

(30) Foreign Application Priority Data
Feb. 14, 2022 (CN) .......................... 202210132734.X

(51) Int. Cl.
*G02F 1/1333* (2006.01)
*G02F 1/1335* (2006.01)
(Continued)

(52) U.S. Cl.
CPC .... *G02F 1/13336* (2013.01); *G02F 1/133388* (2021.01); *G02F 1/133512* (2013.01);
(Continued)

(58) Field of Classification Search
None
See application file for complete search history.

(56) References Cited

U.S. PATENT DOCUMENTS 5,889,568 A      3/1999   Seraphim et al.
2021/0210522 A1  7/2021   Liu et al.

FOREIGN PATENT DOCUMENTS

CN     111293135 A      6/2020
CN     111399280 A      7/2020
(Continued)

OTHER PUBLICATIONS

International Search Report in International application No. PCT/CN2022/078034, mailed on Nov. 11, 2022.
(Continued)

*Primary Examiner* — Phu Vu
(74) *Attorney, Agent, or Firm* — Nathan & Associates; Menachem Nathan

(57) ABSTRACT

A display unit, a splicing screen, and a display device are provided. The display unit includes an edge area, and the edge area includes a mounting area and a side binding area. The display unit further includes: a first driving circuit layer located in the edge area and disposed on a side of the base substrate, a plurality of micro light-emitting elements disposed on the first driving circuit layer, and a binding part disposed in the side binding area and connected to the first driving circuit layer.

17 Claims, 4 Drawing Sheets

(51) Int. Cl.
G02F 1/13357 (2006.01)
G02F 1/1339 (2006.01)
G02F 1/1362 (2006.01)

(52) U.S. Cl.
CPC .. *G02F 1/133514* (2013.01); *G02F 1/133615* (2013.01); *G02F 1/13394* (2013.01); *G02F 1/136286* (2013.01)

(56) References Cited

FOREIGN PATENT DOCUMENTS

| | | | |
|---|---|---|---|
| CN | 212460249 U | | 2/2021 |
| CN | 112946962 A | | 6/2021 |
| CN | 113066363 A | | 7/2021 |
| CN | 113257121 A | | 8/2021 |
| CN | 113703211 A | | 11/2021 |
| CN | 113763837 A | * | 12/2021 |
| CN | 113763837 A | | 12/2021 |
| CN | 113990209 A | | 1/2022 |
| CN | 114038340 A | | 2/2022 |
| WO | 2021189632 A1 | | 9/2021 |

OTHER PUBLICATIONS

Written Opinion of the International Search Authority in International application No. PCT/CN2022/078034, mailed on Nov. 11, 2022.

* cited by examiner

DISPLAY UNIT, SPLICING SCREEN, AND DISPLAY DEVICE

FIELD OF INVENTION

The present application relates to the field of display technologies, and more particularly to a display unit, a splicing screen, and a display device.

BACKGROUND OF INVENTION

At present, large-scale and multi-modality are two major development directions of displays. Nowadays, a size of mainstream display devices has grown from 20 inches to 40 inches, 65 inches, and 85 inches. With a rapid development of an outdoor display market, large size and high resolution have become the development direction of outdoor display. Therefore, people's demand for large-size display devices is constantly increasing.

For large-sized display devices, such as liquid crystal display (LCD) display devices or organic light-emitting diode (OLED) display devices, conventional small-sized display devices have advantages of low cost and high resolution. Compared with small-sized display devices, large-sized display devices are limited by the process, the yield is not high, and there are many issues such as transportation and mounting. Therefore, a large-size display device is currently formed by splicing a plurality of small panels.

At present, in a splicing display panel, an outer lead bonding (OLB) area for bonding needs to be reserved in a frame area of the small panel used for splicing. As a result, a border of the display panel is usually wide, which seriously affects an overall performance of a splicing display image, and cannot achieve high-quality seamless splicing display.

Technical Problem

The main purpose of the present application is to provide a display unit, a splicing screen, and a display device to solve the issue of poor display performance of a splicing panel.

SUMMARY OF INVENTION

In order to achieve the above purpose, the present application provides a display unit comprising a display area and an edge area, wherein the edge area is disposed at an edge of the display area, the edge area comprises a mounting area and a side binding area, the side binding area is disposed away from an end of the display area, the display unit further comprises:
  a base substrate extending from the display area to the mounting area;
  a first driving circuit layer located in the edge area, wherein the first driving circuit layer is disposed on a side of the base substrate;
  a plurality of micro light-emitting elements disposed on the first driving circuit layer, wherein the micro light-emitting elements are located in the mounting area, and the micro light-emitting elements are connected to the first driving circuit layer; and
  a binding part disposed in the side binding area, wherein the binding part is connected to the first driving circuit layer.

In the display unit of the present application, the display unit further comprises:
  a second driving circuit layer partially located in the display area, wherein the second driving circuit layer is disposed on a side of the base substrate facing away from the micro light-emitting elements, the second driving circuit layer is connected to the binding part, and the second driving circuit layer is used to drive the display area to display.

In the display unit of the present application, the second driving circuit layer comprises: a connecting line extending from the display area to the side binding area on the base substrate;
  the binding part further comprises a conductive layer, and the connection line is connected to the conductive layer.

In the display unit of the present application, the first driving circuit layer and the second driving circuit layer are respectively located on opposite sides of the base substrate.

In the display unit of the present application, the display unit further comprises:
  a color filter substrate disposed opposite to a side of the base substrate facing away from the micro light-emitting elements, wherein the color filter substrate extends along the display area to the mounting area; and
  a liquid crystal layer located in the display area, wherein the liquid crystal layer is disposed between the color filter substrate and the base substrate.

In the display unit of the present application, the display unit further comprises:
  a sealant located in the mounting area, wherein the color filter substrate and the base substrate are respectively attached to two ends of the sealant, the sealant is located at an end close to the display area, the sealant is spaced from the binding part, and the micro light-emitting elements are disposed on the sealant.

In the display unit of the present application, the display unit further comprises:
  a light-shielding layer disposed on a side of the color filter substrate facing the micro light-emitting elements, wherein the light-shielding layer is located in the mounting area.

In the display unit of the present application, the display unit further comprises:
  a support member comprising a first surface and a second surface disposed adjacently, wherein the first surface is in contact with the binding part, and the second surface is in contact with a surface of the color filter substrate facing the base substrate.

In the display unit of the present application, the color filter substrate comprises a plurality of color photoresists and a plurality of black photoresists, and the color photoresists and the black photoresists are alternately disposed in sequence;
  the color photoresists in the display area and the support member in the edge area are made of a same material and formed in a same process.

In the display unit of the present application, the display unit further comprises:
  a display control device connected to the binding part, wherein the display control device is used to control a synchronous display of the display area and the mounting area.

The present application further provides a splicing screen comprising a plurality of display units, wherein adjacent display units are spliced with each other, each of the display units comprises a display area and an edge area, the edge area is disposed at an edge of the display area, the edge area comprises a mounting area and a side binding area, the side binding area is disposed away from an end of the display area, the display unit further comprises:
  a base substrate extending from the display area to the mounting area;
  a first driving circuit layer located in the edge area, wherein the first driving circuit layer is disposed on a side of the base substrate;
  a plurality of micro light-emitting elements disposed on the first driving circuit layer, wherein the micro light-emitting elements are located in the mounting area, and the micro light-emitting elements are connected to the first driving circuit layer; and
  a binding part disposed in the side binding area, wherein the binding part is connected to the first driving circuit layer.

In the splicing screen of the present application, the display unit further comprises:
  a second driving circuit layer partially located in the display area, wherein the second driving circuit layer is disposed on a side of the base substrate facing away from the micro light-emitting elements, the second driving circuit layer is connected to the binding part, and the second driving circuit layer is used to drive the display area to display.

In the splicing screen of the present application, the second driving circuit layer comprises: a connecting line extending from the display area to the side binding area on the base substrate;
the binding part further comprises a conductive layer, and the connection line is connected to the conductive layer.

In the splicing screen of the present application, the display unit further comprises:
  a color filter substrate disposed opposite to a side of the base substrate facing away from the micro light-emitting elements, wherein the color filter substrate extends along the display area to the mounting area; and
  a liquid crystal layer located in the display area, wherein the liquid crystal layer is disposed between the color filter substrate and the base substrate.

In the splicing screen of the present application, the display unit further comprises:
  a sealant located in the mounting area, wherein the color filter substrate and the base substrate are respectively attached to two ends of the sealant, the sealant is located at an end close to the display area, the sealant is spaced from the binding part, and the micro light-emitting elements are disposed on the sealant.

In the splicing screen of the present application, the display unit further comprises:
  a light-shielding layer disposed on a side of the color filter substrate facing the micro light-emitting elements, wherein the light-shielding layer is located in the mounting area.

In the splicing screen of the present application, the display unit further comprises:
  a support member comprising a first surface and a second surface disposed adjacently, wherein the first surface is in contact with the binding part, and the second surface is in contact with a surface of the color filter substrate facing the base substrate.

In the splicing screen of the present application, the display unit further comprises:
  a display control device connected to the binding part, wherein the display control device is used to control a synchronous display of the display area and the mounting area.

The present application further provides a display device comprising a splicing screen, wherein the splicing screen comprises a plurality of display units, and adjacent display units are spliced with each other;
  each of the display units comprises a display area and an edge area, the edge area is disposed at an edge of the display area, the edge area comprises a mounting area and a side binding area, the side binding area is disposed away from an end of the display area, the display unit further comprises:
  a base substrate extending from the display area to the mounting area;
  a first driving circuit layer located in the edge area, wherein the first driving circuit layer is disposed on a side of the base substrate;
  a plurality of micro light-emitting elements disposed on the first driving circuit layer, wherein the micro light-emitting elements are located in the mounting area, and the micro light-emitting elements are connected to the first driving circuit layer; and
  a binding part disposed in the side binding area, wherein the binding part is connected to the first driving circuit layer.

In the splicing screen of the present application, the display unit further comprises:
  a second driving circuit layer partially located in the display area, wherein the second driving circuit layer is disposed on a side of the base substrate facing away from the micro light-emitting elements, the second driving circuit layer is connected to the binding part, and the second driving circuit layer is used to drive the display area to display.

Beneficial Effect

In a display unit, a splicing screen, and a display device in the present application, a first driving circuit layer is provided in an edge area of a side of a base substrate by arranging the base substrate to extend from a display area to a mounting area. Micro light-emitting elements are disposed in the mounting area, and the micro light-emitting elements are connected to the first driving circuit layer. The micro light-emitting elements are driven to emit light by the first driving circuit layer, and a binding part arranged in a side binding area is connected to the first driving circuit layer. When the display unit of the present application is used for splicing panels, the edge area of the display unit can be fully utilized, thereby reducing or eliminating seams of splicing panels. In addition, by arranging the binding part in the side binding area, it is beneficial to improve a space utilization rate of a splicing area of the display unit and also ensure a display performance of the micro light-emitting elements in the mounting area. This is beneficial to improve the display performance of the display unit, thereby improving an overall display performance of the display screen.

DESCRIPTION OF DRAWINGS

In order to more clearly describe the technical solutions in the embodiments of the present application, the following will briefly introduce the drawings that need to be used in the description of the embodiments. The drawings in the following description are only some embodiments of the application. For those skilled in the art, without creative work, other drawings can be obtained based on these drawings.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

In the description of the present application, it should be understood that the orientation or positional relationship indicated by the terms "center", "longitudinal", "lateral", "length", "width", "thickness", "upper", "lower", "front", "back", "left", "right", "vertical", "horizontal", "top", "bottom", "inside", "outside" and the like is based on the orientation or positional relationship shown in the accompanying drawings. This is only for ease of describing the application and to simplify the description. It is not indicated or implied that the referred device or element must have a particular orientation, be constructed and operate in a particular orientation. Therefore, it should not be construed as a limitation on this application. In addition, the terms "first" and "second" are only used for descriptive purposes, and should not be construed as indicating or implying relative importance or implying the number of indicated technical features. Thus, features defined as "first", "second" may expressly or implicitly include one or more of said features. In the description of this application, "plurality" means two or more, unless expressly and specifically defined otherwise.

In the present application, the term "exemplary" is used to mean "serving as an example, case, or illustration." Any embodiment described in the present application as "exemplary" is not necessarily to be construed as preferred or advantageous over other embodiments. The following description is presented to enable those skilled in the art to make and use the present application. In the following description, details are set forth for the purpose of explanation. It is to be understood that those skilled in the art can realize that the present application may be practiced without the use of these specific details. In other instances, well-known structures and procedures have not been described in detail so as not to obscure the description of the present application with unnecessary detail. Therefore, the present application is not intended to be limited to the embodiments shown but is to be accorded the widest scope consistent with the principles and features disclosed herein.

Embodiments of the present application provide a display unit, a splicing screen, and a display device, which will be described in detail below.

Figure 1:
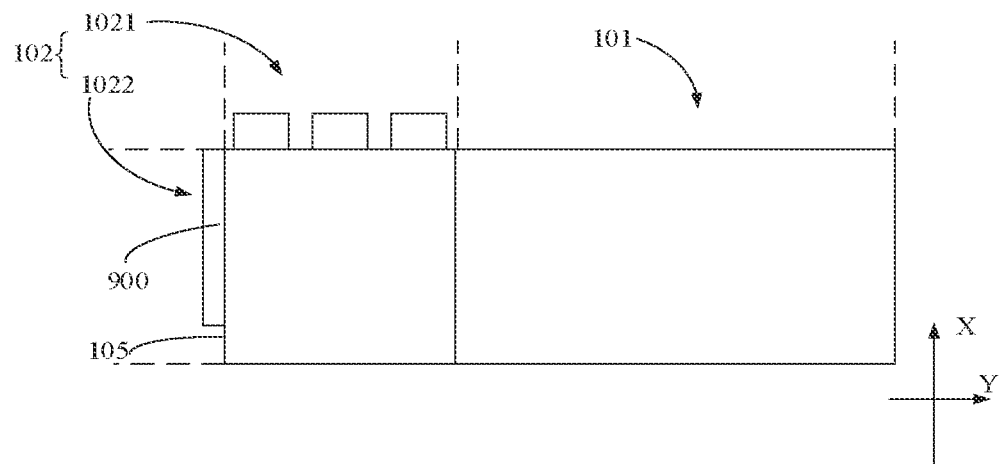
FIG. 1 is a schematic structural diagram of a display unit provided by an embodiment of the present application.
Figure 2:
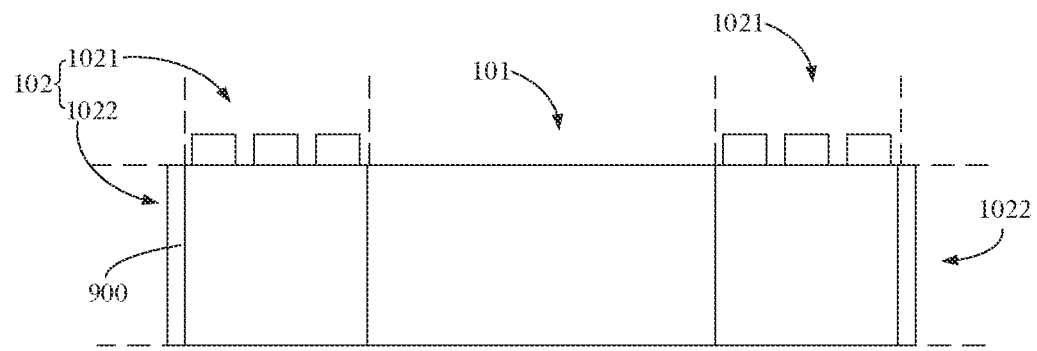
FIG. 2 is a schematic structural diagram of a display unit provided by another embodiment of the present application.
Figure 3:
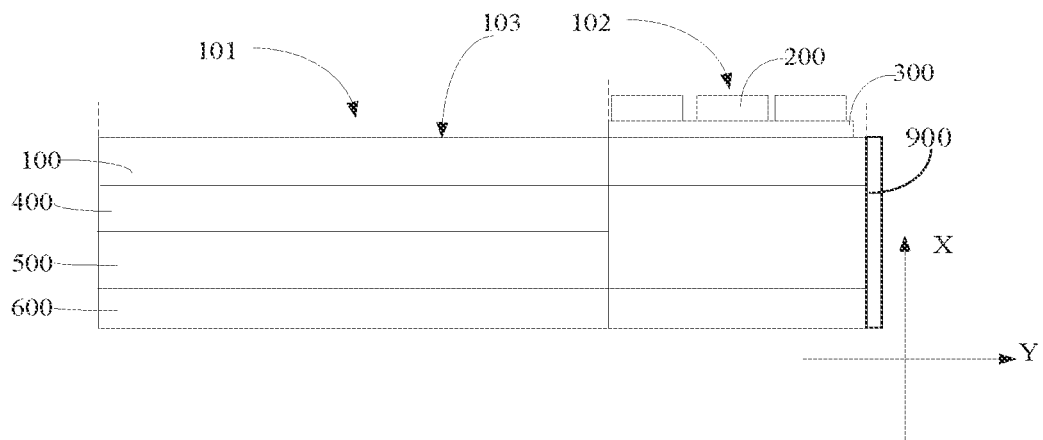
FIG. 3 is a schematic structural diagram of a display unit provided by another embodiment of the present application.

Referring to FIG. 1 to FIG. 3, an embodiment of the present application provides a display unit 10, which is applied to a splicing screen. The display unit 10 includes a base substrate 100, a plurality of micro light-emitting elements 200, a first driving circuit layer 300, and a binding part 900.

The display unit 10 further includes a display area 101 and an edge area 102, and the edge area 102 is disposed at an edge of the display area 101. The edge area 102 is located on at least one side of the display area 101. Exemplarily, the edge area 102 may be located on one side of the display area 101, or may be located on both sides of the display area 101 (as shown in FIG. 2). Of course, it can be also arranged around the display area 101, which is not specifically limited here.

The edge area 102 also includes a mounting area 1021 and a side binding area 1022. The mounting area 1021 is a non-light-emitting area, and the edge area 102 is used for mounting the micro light-emitting elements 200, thereby visually eliminating the seam formed by the edge area 102 between the two display units 10. The side binding area 1022 is used for binding, thereby enabling the display area 101 and the edge area 102 to emit light. Specifically, the base substrate 100 extends along the first direction X, the binding surface 105 is disposed along the second direction Y, and the first direction X and the second direction Y intersect. In this embodiment, both the first direction and the second direction are acceptable.

The base substrate 100 has a light-emitting surface 103 in the display area 101, which is used for light-emitting display of the display unit 10. The light-emitting surface 103 is the side of the base substrate 100 facing the micro light-emitting elements 200. The display unit 10 has a mounting area 1021 in the edge area 102, the base substrate 100 includes a mounting surface 104 in the mounting area 1021, and the mounting surface 104 is the side of the base substrate 100 facing the micro light-emitting elements 200. Specifically, the normal line of the mounting surface 104 and the normal line of the light-emitting surface 103 are both arranged along the first direction X. The mounting surface 104 and the light-emitting surface 103 may be arranged parallel to each other, or may be arranged coplanarly. The mounting surface 104 and the light-emitting surface 103 may be disposed along the same side, or may be disposed along two opposite sides of the display unit 10. Exemplarily, both the light-emitting surface 103 and the mounting surface 104 are disposed upward. In this embodiment, the first direction X may be, for example, a vertical direction, and correspondingly, the light-emitting surface 103 and the mounting surface 104 are arranged along a horizontal plane. Of course, the first direction X may also be, for example, a horizontal direction, and correspondingly, the light-emitting surface 103 and the mounting surface 104 are arranged along a vertical plane. There is no specific restriction here.

Multiple micro light-emitting elements 200 are disposed on the mounting surface 104. The micro light-emitting elements 200 may be micro light-emitting diodes, such as mini-LEDs or micro-LEDs. Multiple miniature light-emitting diodes are arranged on the mounting surface 104 in an array. In each pixel, the miniature light-emitting diodes may at least include red light diodes, green light diodes, and blue light diodes which are arranged in sequence, and are respectively used for emitting RGB three-color light.

The binding part 900 is disposed in the side binding area 1022, and the base substrate 100 has a binding surface 105 in the side binding area 1022. The side binding area 1022 is disposed at one end away from the display area 101, and the binding surface 105 is the side surface of the base substrate 100. The binding surface 105 is arranged along the first direction X. One end of the binding part 900 is connected to the first driving circuit layer 300 and the second driving circuit layer 400, and another end of the binding part 900 is connected to an external power source for driving, thereby ensuring normal light emission of the display area 101 and the edge area 102.

The base substrate 100 is disposed along the second direction Y, and the first direction X and the second direction Y intersect. In this embodiment, the second direction Y and the first direction X may be directions perpendicular to each other. Exemplarily, when the first direction X is a vertical direction, and the second direction Y can be a horizontal direction, the base substrate 100 is arranged in a horizontal direction, and the binding part 900 is arranged in a vertical direction. In the splicing panel, a part of the seam of the splicing unit is formed by the binding part 900. Therefore, by disposing the binding part 900 on the binding surface 105 disposed along the first direction X, that is, binding on the side surface of the base substrate 100, the binding part 900 is side-bound. Therefore, an area ratio of the binding part 900 in the entire display unit 10 can be effectively reduced, so that the area of the seam can be further reduced.

The display unit 10 of the embodiment of the present application is applied to a splicing screen. By arranging the base substrate 100 to extend from the display area 101 to the edge area 102, the first driving circuit layer 300 is disposed in the edge area 102 on one side of the base substrate 100. The micro light-emitting elements 200 are disposed in the edge area 102 to connect the micro light-emitting elements 200 with the first driving circuit layer 300. The micro light-emitting elements 200 are driven to emit light by the first driving circuit layer 300, and the binding part 900 disposed in the side binding area 1022 is connected to the first driving circuit layer 300. When the display unit 10 of the present application is used for splicing panels, the edge area 102 of the display unit 10 can be fully utilized to reduce or eliminate the seams of the splicing panels. In addition, by arranging the binding part 900 in the side binding area 1022, it is beneficial to improve the space utilization rate of the splicing area of the display unit 10. This ensures the display performance of the micro light-emitting elements 200 in the mounting area 1021, which is beneficial to improve the display performance of the display unit 10 and further improve the overall display performance of the display screen.

In some embodiments, the display unit 10 further includes a base substrate 100 and a first driving circuit layer 300.

The base substrate 100 extends from the display area 101 to the edge area 102. The base substrate 100 may be a rigid substrate. For example, the base substrate 100 may be a glass substrate. Of course, the base substrate 100 may also be a flexible substrate, which is not specifically limited herein.

The first driving circuit layer 300 is located in the edge area 102, and the first driving circuit layer 300 is disposed on one side of the base substrate 100. The micro light-emitting elements 200 are connected to the first driving circuit layer 300. Taking the micro light-emitting elements 200 as mini-LEDs as an example, the first driving circuit layer 300 drives the micro light-emitting elements 200 to emit light, so that the display unit 10 realizes direct LED light emission in the edge area 102, and the structure is simple. It should be understood that the first driving circuit layer 300 may include a pixel driving circuit, and the pixel driving circuit may include a plurality of thin film transistors (TFTs), capacitors, driving lines, connecting lines, and the like. The thin film transistor may include at least one of a driving transistor, a switching transistor, and the like, and the driving lines may include traces such as scan lines and data lines.

The display unit 10 may be a liquid crystal (LCD) or organic light-emitting (OLED) display unit or the like. Taking the display unit 10 as a liquid crystal display unit as an example, in some embodiments, as shown in FIG. 3, the display unit 10 further includes a color filter substrate 700 and a liquid crystal layer 500. The color filter substrate 700 is disposed opposite to the side of the base substrate 100 facing away from the micro light-emitting elements 200, and the color filter substrate 700 extends along the display area 101 to the edge area 102. The liquid crystal layer 500 is located in the display area 101, and the liquid crystal layer 500 is disposed between the color filter substrate 700 and the base substrate 100. A common electrode layer 600 is further disposed between the liquid crystal layer 500 and the color filter substrate 700, and the common electrode layer 600 and the pixel electrode layer 480 jointly drive the liquid crystal molecules in the liquid crystal layer 500 to work.

Figure 4:
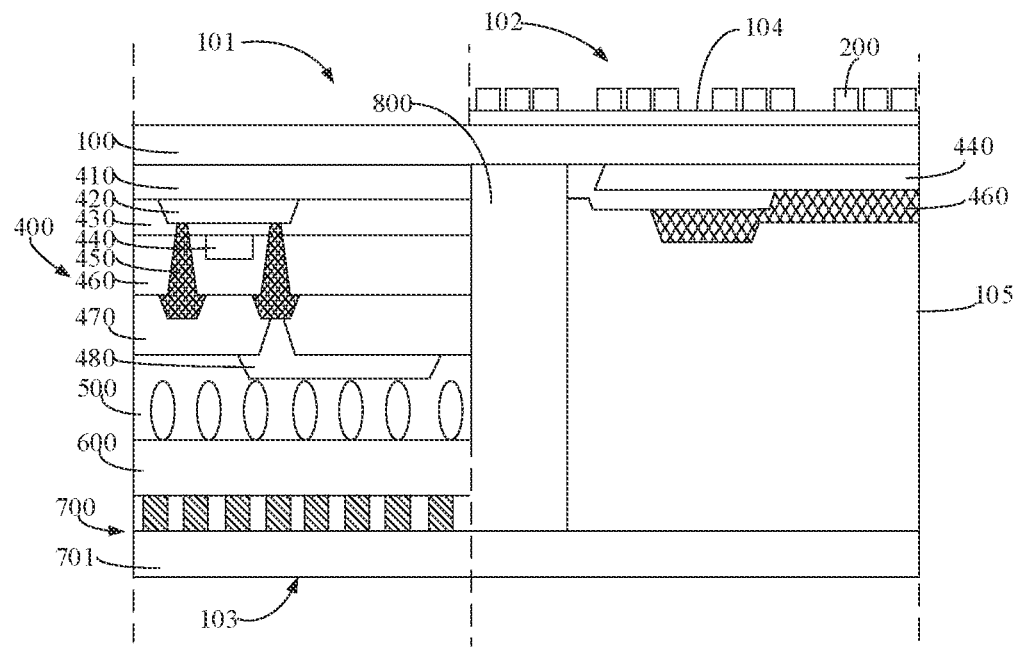
FIG. 4 is a schematic structural diagram of a second driving circuit layer of a display unit provided by an embodiment of the present application.

Referring to FIG. 4, in some embodiments, the display unit 10 further includes a second driving circuit layer 400.

Part of the second driving circuit layer 400 is located in the display area 101, and the second driving circuit layer 400 is disposed on the side of the base substrate 100 facing away from the micro light-emitting elements 200. The second driving circuit layer 400 is connected to the binding part 900, and the second driving circuit layer 400 is used for driving the display area 101 to display. The second driving circuit layer 400 is used for driving the display area 101 to display. By connecting both the first driving circuit layer 300 and the second driving circuit layer 400 to the binding part 900, there is no need to additionally set the binding structure of the second driving circuit layer 400, which is beneficial to further simplify the structure of the display unit. The first driving circuit layer 300 and the second driving circuit layer 400 can work together to drive the display area 101 and the mounting area 1021 to display the same picture. The first driving circuit layer 300 and the second driving circuit layer 400 may be located on opposite sides of the base substrate 100 respectively, that is, the base substrate 100 may use a double-sided process to manufacture the driving circuits. It can be understood that the second driving circuit layer 400 may include pixel driving circuits. The pixel driving circuit may include a plurality of thin film transistors (TFTs), capacitors, driving lines, connecting lines, and the like. The thin film transistor may include at least one of a driving transistor, a switching transistor, and the like. The driving lines may include traces such as scan lines and data lines. As shown in FIG. 3, the TFT device film layer of the second driving circuit layer 400 may include a buffer layer 410, an active layer 420, a gate insulating layer 430, a first metal layer 440, an interlayer dielectric layer 450, a second metal layer 460, a planarization layer 470, and a pixel electrode layer 480.

In some embodiments, the display unit 10 further includes a sealant 800. The sealant 800 is located in the edge area 102, and the color filter substrate 700 and the base substrate 100 are respectively attached to both ends of the sealant 800. The sealant 800 is located near one end of the display area 101. The sealing of the display area 101 of the display unit 10 can be achieved through the arrangement of the sealant 800. The micro light-emitting elements 200 are disposed above the sealant 800, so that the edge area 102 can be further fully utilized, thereby realizing the performance of reducing or eliminating the seams of the splicing panel.

In some embodiments, the display unit 10 further includes a support member 950. The support member 950 includes a first surface 951 and a second surface 952 disposed adjacently. The first surface 951 is in contact with the binding part 900, and the second surface 952 is in contact with the surface of the color filter substrate 700 facing the base substrate 100. The support member 950 is made of insulating material. The shape of the cross section of the support member 950 may be a triangle, a square, a rectangle, etc., which is not specifically limited herein. The disposition of the support member 950 can provide support when the binding part 900 is formed on the side surface of the display unit 10. This prevents the display unit 10 from collapsing inward toward the gap between the color filter substrate 700 and the base substrate 100, so that the structural stability of the binding part 900 can be ensured.

In the display area 101, the color filter substrate 700 includes a transparent substrate 701, a plurality of color photoresists 702, and a plurality of black photoresists 703. The color photoresist 702 and the black photoresist 703 are disposed on the side of the transparent substrate 701 facing the base substrate 100. The color photoresist 702 may include red photoresist, green photoresist, and blue photoresist. The color photoresists 702 and the black photoresists 703 are arranged alternately in sequence. The black photoresists 703 are used to prevent a cross-color issue caused by the light passing through the color photoresists 702 of different colors when emitting light.

In the mounting area 1021, when the mounting surface 104 and the light-emitting surface 103 are disposed along opposite sides of the display unit 10, specifically, the display unit 10 further includes a backlight assembly (not shown in the figure), and the backlight assembly is disposed on the side of the base substrate 100 facing away from the liquid crystal layer 500, that is, the backlight assembly is disposed on the side of the base substrate 100 facing away from the liquid crystal layer 500. Further, the light-emitting surface 103 is the side of the transparent substrate 701 facing away from the liquid crystal layer 500. As shown in FIG. 4, the color filter substrate 700 may include only the transparent substrate 701. The micro light-emitting elements 200 on the mounting surface 104 can emit light toward one side of the transparent substrate 701, which can help save materials. Further, the support member 950 may be disposed on the transparent substrate 701, the first surface 951 of the support member 950 is abutted with the binding part 900, and the second surface 952 of the transparent substrate 701 is abutted. The color photoresist 702 in the display area 101 and the support member 950 in the edge area 102 are made of the same material and formed in the same process. For example, the support member 950 and the blue photoresist are made of the same material, therefore, while the support member 950 plays a supporting role, it is beneficial to save the preparation process.

Figure 5:
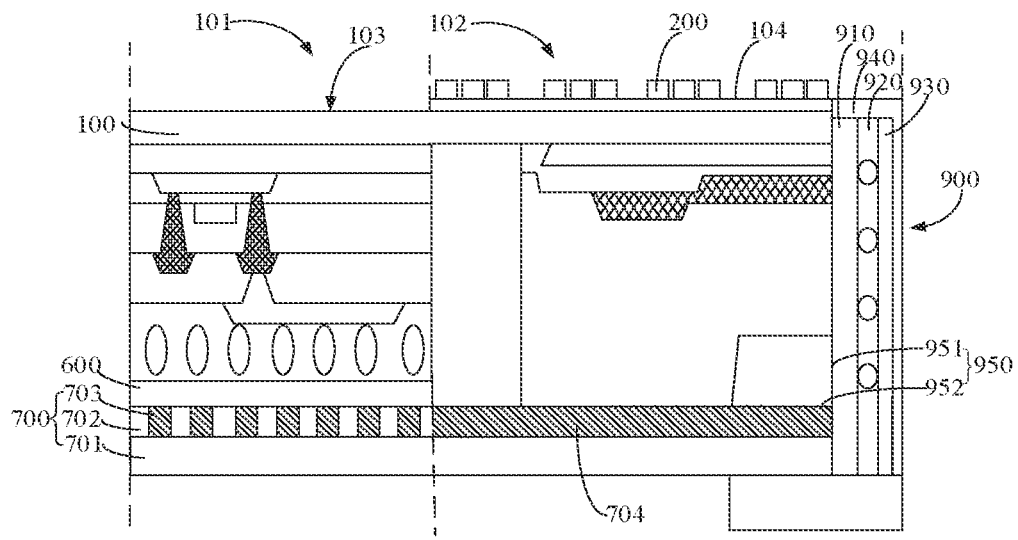
FIG. 5 is a schematic structural diagram of a binding part of a display unit provided by an embodiment of the present application.

In the mounting area 1021, when the mounting surface 104 and the light-emitting surface 103 are arranged along the same side of the display unit 10, specifically, the backlight assembly of the display unit is disposed on the side of the color filter substrate 700 facing away from the liquid crystal layer 500, that is, the backlight assembly is disposed on the side of the transparent substrate 701 facing away from the liquid crystal layer 500, that is, the light-emitting surface 103 is the side of the base substrate 100 facing away from the liquid crystal layer 500. In addition, the micro light-emitting elements 200 in the mounting area 1021 emit light to the side away from the transparent substrate 701, as shown in FIG. 5. The color filter substrate 700 may include a transparent substrate 701 and a black photoresist 703, and the black photoresist 703 is disposed on the side of the transparent substrate 701 facing the base substrate 100.

Correspondingly, in some embodiments, the display unit 10 further includes a light-shielding layer 704. The entire surface of the light-shielding layer 704 is disposed on the side of the color filter substrate 700 facing the micro light-emitting elements 200. The light-shielding layer 704 is located in the mounting area 1021. The light-shielding layer 704 is used to prevent the micro light-emitting elements 200 in the mounting area 1021 from leaking light to one side of the transparent substrate 701. The black photoresist 703 in the display area 101 and the light-shielding layer 704 in the mounting area 1021 can be prepared and formed by using the same material in the same process. The black photoresist 703 and the light-shielding layer 704 can be disposed at intervals in the same layer, which is beneficial to save the preparation process while preventing the light leakage of the mounting area 1021.

In some embodiments, the second driving circuit layer 400 further includes connecting lines. The connection lines extend from the display area 101 to the edge area 102 on the base substrate 100. Specifically, the connection lines include metal traces formed by the first metal layer 440 and the second metal layer 460 extending from the display area 101 to the edge area 102. Therefore, it is possible to ensure the normal light-emitting display of the display area 101 without occupying extra space, and the space of the edge area 102 can be fully utilized. The connection lines are used for connection between the second driving circuit layer 400 and the binding part 900. Exemplarily, the connection lines are used for connection between the TFT devices in the second driving circuit layer 400 and the binding part 900.

The display unit 10 also includes a conductive layer 910. The conductive layer 910 is used for connection between the connection lines and the binding part 900. The conductive layer 910 may be conductive silver paste, and the binding part 900 may include a chip on film (COF) 930. In this embodiment, an adhesive layer 920 may be further included between the conductive layer 910 and the chip on film 930. Specifically, the adhesive layer 920 may be an anisotropic conductive film (ACF). The adhesive layer 920 can be used to prevent oxidation of the conductive layer 910 and to achieve conductive communication between metal lines. The display unit 10 may further include a protective layer 940. The protective layer 940 is disposed on the side of the chip on film 930 facing away from the adhesive layer 920. The protective layer 940 can be made of protective glue, which is beneficial to avoid damage to the metal lines on the chip on film 930 during transportation.

Figure 6:
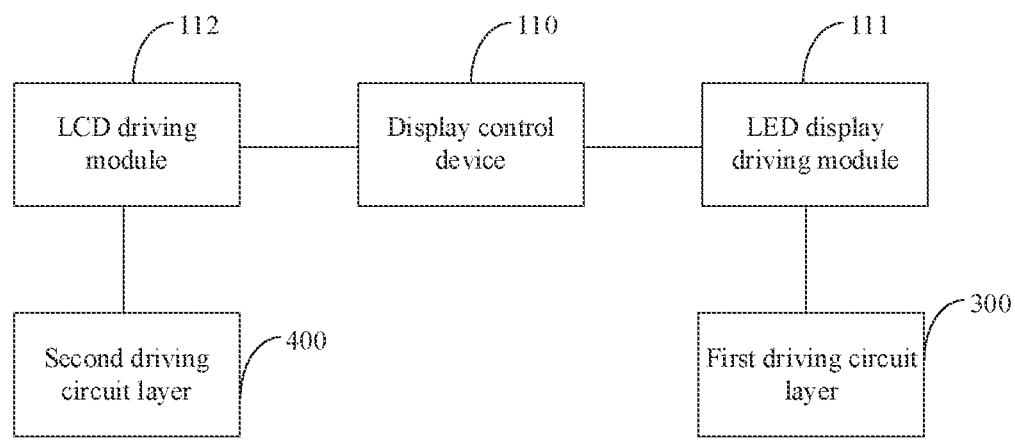
FIG. 6 is a schematic structural diagram of a display unit provided by an embodiment of the present application.

In some embodiments, as shown in FIG. 6, the display unit 10 further includes a display control device 110. The display control device 110 is connected to the binding part 900. The display control device 110 is used for controlling the display area 101 and the edge area 102 to be displayed synchronously. Taking the display area 101 of the display unit 10 of the present application as a liquid crystal display and the mounting area 1021 as an LED display as an example, the second driving circuit layer 400 of the display unit 10 is connected to the liquid crystal display driving module 112 through the binding part 900. The first driving circuit layer 300 of the mounting area 1021 is connected to the LED display driving module 111 through the binding part 900. The display control device 110 may also include a synchronization signal port. The synchronization signal port of the LED display driving module 111 and the synchronization signal port of the liquid crystal display driving module 112 are respectively connected through the synchronization signal port. By setting the synchronization signal ports corresponding to the LED display driving module 111 and the liquid crystal display driving module 112, the LED display and the liquid crystal display can be synchronously displayed. That is, the display area 101 and the edge area 102 can display images synchronously, so as to realize the performance of visual seamless splicing.

Figure 7:
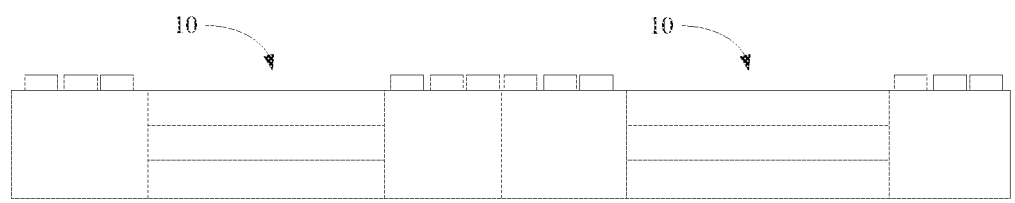
FIG. 7 is a schematic structural diagram of a splicing screen provided by an embodiment of the present application.

On the other hand, referring to FIG. 7, in order to better implement the display unit 10 of the present application, an embodiment of the present application further provides a splicing screen, which includes a plurality of display units 10. Adjacent display units 10 are spliced with each other. In the splicing screen of the embodiment of the present application, the base substrate 100 is arranged to extend from the display area 101 to the edge area 102, so that the first driving circuit layer 300 is disposed in the edge area 102 on one side of the base substrate 100. The micro light-emitting elements 200 are arranged in the edge area 102. The micro light-emitting elements 200 are connected to the first driving circuit layer 300. The micro light-emitting elements 200 are driven to emit light by the first driving circuit layer 300. The binding part 900 disposed in the side binding area 1022 is connected to the first driving circuit layer 300. When the display unit 10 of the present application is used for splicing panels, its edge area 102 can be fully utilized. This reduces or eliminates the seams of the splicing panel. In addition, by arranging the binding part 900 in the side binding area 1022, it is beneficial to improve the space utilization rate of the splicing area of the display unit 10. Guaranteeing the display performance of the micro light-emitting elements 200 in the edge area 102 is beneficial to improve the display performance of the display unit 10, thereby improving the overall display performance of the display screen.

Since the splicing screen adopts the above-mentioned display unit 10, the splicing screen also has all the beneficial effects brought by the above-mentioned display unit 10, which will not be repeated here.

On the other hand, in order to better implement the splicing screen of the present application, an embodiment of the present application further provides a display device including a splicing screen. Since the display device has the above-mentioned splicing screen, it has all the same beneficial effects, which will not be repeated in this embodiment. The embodiments of the present application do not specifically limit the application of liquid crystal display devices, which may be It can be any product or part with display function such as TV, laptop, tablet, wearable display device (such as smart bracelet, smart watch, etc.), mobile phone, virtual reality device, augmented reality device, car display, advertising light box, etc.

During specific implementation, the above units or structures can be implemented as independent entities, or can be arbitrarily combined to implement as one or several entities. For the specific implementation of the above units or structures, reference may be made to the foregoing method embodiments, and details are not described herein again.

A display unit, a splicing screen, and a display device provided by the embodiments of the present application have been described in detail above. Specific examples are used herein to illustrate the principles and implementations of the present application. The descriptions of the above embodiments are only used to help understand the method and the core idea of the present application. In addition, for those skilled in the art, according to the idea of the present application, there will be changes in the specific embodiments and application scope. In conclusion, the content of this specification should not be construed as a limitation on the present application.

What is claimed is:

1. A display unit, comprising:
a display area and an edge area, wherein the edge area is disposed at an edge of the display area, the edge area comprises a mounting area and a side binding area, the side binding area is disposed away from an end of the display area, the display unit further comprises:
a base substrate extending from the display area to the mounting area;
a first driving circuit layer located in the edge area, wherein the first driving circuit layer is disposed on a side of the base substrate;
a plurality of micro light-emitting elements disposed on the first driving circuit layer, wherein the micro light-emitting elements are located in the mounting area, and the micro light-emitting elements are connected to the first driving circuit layer; and
a binding part disposed in the side binding area, wherein the binding part is connected to the first driving circuit layer;
wherein the display unit further comprises:
a second driving circuit layer partially located in the display area, wherein the second driving circuit layer is disposed on a side of the base substrate facing away from the micro light-emitting elements, the second driving circuit layer is connected to the binding part, and the second driving circuit layer is used to drive the display area to display.

2. The display unit according to claim 1, wherein the second driving circuit layer comprises: a connecting line extending from the display area to the side binding area on the base substrate;
wherein the binding part further comprises a conductive layer, and the connection line is connected to the conductive layer.

3. The display unit according to claim 1, wherein the first driving circuit layer and the second driving circuit layer are respectively located on opposite sides of the base substrate.

4. The display unit according to claim 1, wherein the display unit further comprises:
a color filter substrate disposed opposite to a side of the base substrate facing away from the micro light-emitting elements, wherein the color filter substrate extends along the display area to the mounting area; and
a liquid crystal layer located in the display area, wherein the liquid crystal layer is disposed between the color filter substrate and the base substrate.

5. The display unit according to claim 4, wherein the display unit further comprises:
a sealant located in the mounting area, wherein the color filter substrate and the base substrate are respectively attached to two ends of the sealant, the sealant is located at an end close to the display area, the sealant is spaced from the binding part, and the micro light-emitting elements are disposed on the sealant.

6. The display unit according to claim 4, wherein the display unit further comprises:
a light-shielding layer disposed on a side of the color filter substrate facing the micro light-emitting elements, wherein the light-shielding layer is located in the mounting area.

7. The display unit according to claim 4, wherein the display unit further comprises:
a support member comprising a first surface and a second surface disposed adjacently, wherein the first surface is in contact with the binding part, and the second surface is in contact with a surface of the color filter substrate facing the base substrate.

8. The display unit according to claim 7, wherein the color filter substrate comprises a plurality of color photoresists and a plurality of black photoresists, and the color photoresists and the black photoresists are alternately disposed in sequence;
the color photoresists in the display area and the support member in the edge area are made of a same material and formed in a same process.

9. The display unit according to claim 1, wherein the display unit further comprises:
a display control device connected to the binding part, wherein the display control device is used to control a synchronous display of the display area and the mounting area.

10. A splicing screen, comprising:
a plurality of display units, wherein adjacent display units are spliced with each other, each of the display units comprises a display area and an edge area, the edge area is disposed at an edge of the display area, the edge area comprises a mounting area and a side binding area, the side binding area is disposed away from an end of the display area, the display unit further comprises:
a base substrate extending from the display area to the mounting area;
a first driving circuit layer located in the edge area, wherein the first driving circuit layer is disposed on a side of the base substrate;
a plurality of micro light-emitting elements disposed on the first driving circuit layer, wherein the micro light-emitting elements are located in the mounting area, and the micro light-emitting elements are connected to the first driving circuit layer; and
a binding part disposed in the side binding area, wherein the binding part is connected to the first driving circuit layer;
wherein the display unit further comprises:
a second driving circuit layer partially located in the display area, wherein the second driving circuit layer is disposed on a side of the base substrate facing away from the micro light-emitting elements, the second driving circuit layer is connected to the binding part, and the second driving circuit layer is used to drive the display area to display.

11. The splicing screen according to claim 10, wherein the second driving circuit layer comprises: a connecting line extending from the display area to the side binding area on the base substrate;
wherein the binding part further comprises a conductive layer, and the connection line is connected to the conductive layer.

12. The splicing screen according to claim 10, wherein the display unit further comprises:
a color filter substrate disposed opposite to a side of the base substrate facing away from the micro light-emitting elements, wherein the color filter substrate extends along the display area to the mounting area; and
a liquid crystal layer located in the display area, wherein the liquid crystal layer is disposed between the color filter substrate and the base substrate.

13. The splicing screen according to claim 12, wherein the display unit further comprises:
a sealant located in the mounting area, wherein the color filter substrate and the base substrate are respectively attached to two ends of the sealant, the sealant is located at an end close to the display area, the sealant is spaced from the binding part, and the micro light-emitting elements are disposed on the sealant.

14. The splicing screen according to claim 12, wherein the display unit further comprises:
a light-shielding layer disposed on a side of the color filter substrate facing the micro light-emitting elements, wherein the light-shielding layer is located in the mounting area.

15. The splicing screen according to claim 12, wherein the display unit further comprises:
a support member comprising a first surface and a second surface disposed adjacently, wherein the first surface is in contact with the binding part, and the second surface is in contact with a surface of the color filter substrate facing the base substrate.

16. The splicing screen according to claim 10, wherein the display unit further comprises:
a display control device connected to the binding part, wherein the display control device is used to control a synchronous display of the display area and the mounting area.

17. A display device, comprising:
a splicing screen, wherein the splicing screen comprises a plurality of display units, and adjacent display units are spliced with each other;
each of the display units comprises a display area and an edge area, the edge area is disposed at an edge of the display area, the edge area comprises a mounting area and a side binding area, the side binding area is disposed away from an end of the display area, the display unit further comprises:
a base substrate extending from the display area to the mounting area;
a first driving circuit layer located in the edge area, wherein the first driving circuit layer is disposed on a side of the base substrate;
a plurality of micro light-emitting elements disposed on the first driving circuit layer, wherein the micro light-emitting elements are located in the mounting area, and the micro light-emitting elements are connected to the first driving circuit layer; and
a binding part disposed in the side binding area, wherein the binding part is connected to the first driving circuit layer;
wherein the display unit further comprises:
a second driving circuit layer partially located in the display area, wherein the second driving circuit layer is disposed on a side of the base substrate facing away from the micro light-emitting elements, the second driving circuit layer is connected to the binding part, and the second driving circuit layer is used to drive the display area to display.

\* \* \* \* \*